(12) United States Patent
Craig et al.

(10) Patent No.: US 7,060,549 B1
(45) Date of Patent: Jun. 13, 2006

(54) SRAM DEVICES UTILIZING TENSILE-STRESSED STRAIN FILMS AND METHODS FOR FABRICATING THE SAME

(75) Inventors: Mark Craig, Austin, TX (US); Karsten Wieczorek, Dresden (DE); Manfred Horstmann, Duerroehrsdorf-Dittersbach (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 11/174,400

(22) Filed: Jul. 1, 2005

(51) Int. Cl.
*H01L 21/8238* (2006.01)

(52) U.S. Cl. ............... 438/199; 438/201; 438/211; 438/219; 438/221

(58) Field of Classification Search ............ None
See application file for complete search history.

(56) References Cited

U.S. PATENT DOCUMENTS

| | | | |
|---|---|---|---|
| 6,573,172 B1 | 6/2003 | En et al. | |
| 6,906,393 B1 * | 6/2005 | Sayama et al. | 257/414 |
| 2003/0181005 A1 * | 9/2003 | Hachimine et al. | 438/231 |
| 2004/0029323 A1 * | 2/2004 | Shimizu et al. | 438/142 |
| 2004/0097030 A1 * | 5/2004 | Sayama et al. | 438/232 |
| 2004/0217448 A1 * | 11/2004 | Kumagai et al. | 257/627 |
| 2005/0093081 A1 * | 5/2005 | Belyansky et al. | 257/392 |
| 2005/0202603 A1 * | 9/2005 | Sayama et al. | 438/149 |

* cited by examiner

*Primary Examiner*—Ngân V. Ngô
(74) *Attorney, Agent, or Firm*—Ingrassia Fischer & Lorenz PC

(57) ABSTRACT

SRAM devices utilizing tensile-stressed strain films and methods for fabricating such SRAM devices are provided. An SRAM device, in one embodiment, comprises an NFET and a PFET that are electrically coupled and physically isolated. The PFET has a gate region, a source region, and a drain region. A tensile-strained stress film is disposed on the gate region and at least a portion of the source region and the drain region of the PFET. A method for fabricating a cell of an SRAM device comprises fabricating an NFET and a PFET overlying a substrate. The PFET and the NFET are electically coupled and are physically isolated. A tensile-strained stress film is deposited on the gate region and at least a portion of the source region and the drain region of the PFET.

15 Claims, 3 Drawing Sheets

SRAM DEVICES UTILIZING TENSILE-STRESSED STRAIN FILMS AND METHODS FOR FABRICATING THE SAME

FIELD OF THE INVENTION

The present invention generally relates to memory devices, and more particularly relates to SRAM devices and SRAM cell structures that utilize tensile-stressed strain films to degrade the performance of PMOS transistors.

BACKGROUND OF THE INVENTION

Memory devices are very important in the art of digital electronics. Memory devices are used to store software programs and processed data. Write capable memory, such as random access memory, or RAM, is particularly important for storing data. In a Static RAM, or SRAM, device, data written to a memory cell can be stored indefinitely as long as power is supplied to the device. Further, the stored data can be changed by rewriting the cell. However, unlike dynamic RAM, or DRAM, the data value does not have to be periodically refreshed.

FIG. 1 illustrates a conventional SRAM cell 10 in schematic form. The SRAM cell 10 comprises six transistors and therefore is referred to as a 6T cell. In particular, the cell comprises pull-down NMOS field effect transistors (NFETs) 12 and 14, pull-up PMOS field effect transistors (PFETs) 16 and 18, and pass-gate NFETs 20 and 22. Transistor pairs 12 and 16 form a first inverter and transistor pairs 14 and 18 form a second inverter. The input of the first inverter (NFET 12 and PFET 16) is coupled to the output of the second inverter (NFET 14 and PFET 18). Similarly, the input of the second inverter (NFET 14 and PFET 18) is coupled to the output of the first inverter (NFET 12 and PFET 16). In this arrangement, a digital latch is formed. The digital latch, comprising NFET 12, PFET 16, NFET 14, and PFET 18, has two key nodes 24 and 26. The digital latch is electrically able to maintain either of two states. In one state, node 24 is high and node 26 is low. In the other state, node 24 is low and node 26 is high.

Pass-gate NFETs 20 and 22 are used to control access to the digital latch. Pass-gate NFETs 20 and 22 are controlled by a common signal, conveyed on a word line (WL) 28. When WL 28 is asserted, the pass-gate NFETs 20 and 22 are turned ON. In this state, a bit line (BL) 30 is coupled to node 24, and a bit line bar (BLB) or complementary bit line 32 is coupled to node 26. If the WL 28 assertion is due to a READ operation of the cell 10, then the BL 30 and BLB 32 signal lines will be coupled to a high impedance input stage of a bit line sense amplifier (not shown). This amplifier will be used to read the voltage state (high or low) of the BL 30 and BLB 32 signals to thereby determine the stored state of the cell 10. If the WL 28 assertion is due to a WRITE operation, then the BL 30 and BLB 32 signals will be driven to opposite voltages (Vdd and Vss) by a writing circuit (not shown). This will force the digital latch nodes 24 and 26 to the proper write state. When WL 28 is de-asserted, the pass-gate NFETs 20 and 22 are turned OFF, and the write state is held in the digital latch.

A large number of cells 10 can be designed into a memory array so that a large amount of data can be stored. However, there is a never-ending quest to integrate more circuitry onto a single integrated circuit. The goal of integrating entire systems on a chip has resulted in the motivation to include more memory capacity for those systems and, hence, to increase the density of the integrated circuit to include more memory cells in a given area on a chip.

One of the ways in which memory circuitry in general has become more dense is simply by reduction of the size of features (line widths and spaces) of elements making up the circuitry. By reducing these dimensions, SRAM cell density can be increased. However, reducing the width and spacing of features of memory cells, if carried to extremes, can reduce the electrical stability and, hence, manufacturability, of the memory cells.

Accordingly, it is desirable to provide a memory cell that can be scaled in size without a significant reduction in manufacturability. In addition, it is desirable to provide a method for manufacturing a scaled memory cell with desired performance properties. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

An SRAM device is provided. The SRAM device comprises an NFET and a PFET electrically coupled to the NFET and physically isolated from the NFET. The PFET has a channel region, a gate region, a source region, and a drain region. A tensile-strained stress film is disposed on the gate region and at least a portion of the source region and the drain region of the PFET. The tensile-strained stress film applies a tensile stress on the channel region of the PFET.

A method for fabricating a cell of an SRAM device is provided. The method comprises fabricating an NFET in and on a substrate. A PFET having a gate region, a source region, and a drain region is formed in and on the substrate such that, upon fabrication of the PFET and the NFET, the PFET and the NFET are electrically coupled and are physically isolated. A tensile-strained stress film is deposited on the gate region and at least a portion of the source region and the drain region of the PFET.

A method for degrading the carrier mobility of a PFET in the fabrication of a CMOS device is provided. The method comprises fabricating an NFET in and on a substrate. A PFET having a gate region, a source region, and a drain region is formed in and on the substrate such that, upon fabrication of the PFET and the NFET, the PFET and the NFET are electrically coupled and are physically isolated. A silicon nitride film is deposited on the gate region and at least a portion of the source region and the drain region of the PFET such that a uniaxial tensile strain is applied to the channel region of the PFET.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
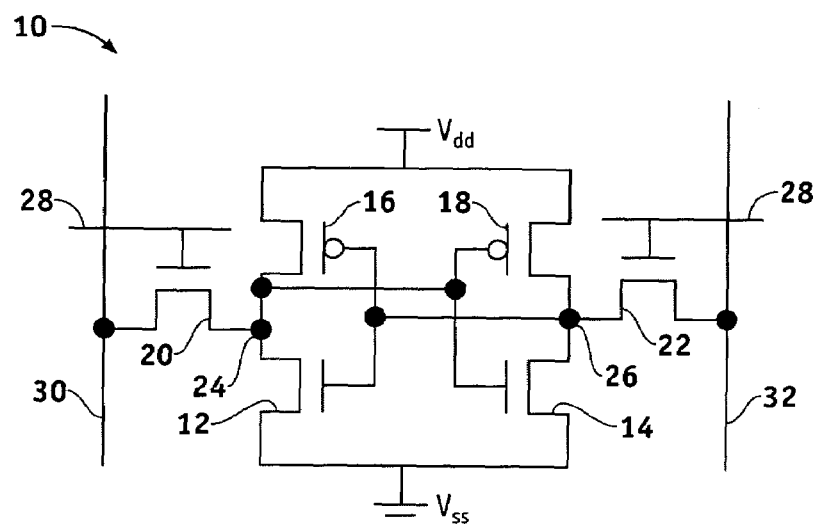
FIG. 1 is a schematic illustration of a conventional six-transistor cell of an SRAM device.
Figure 2:
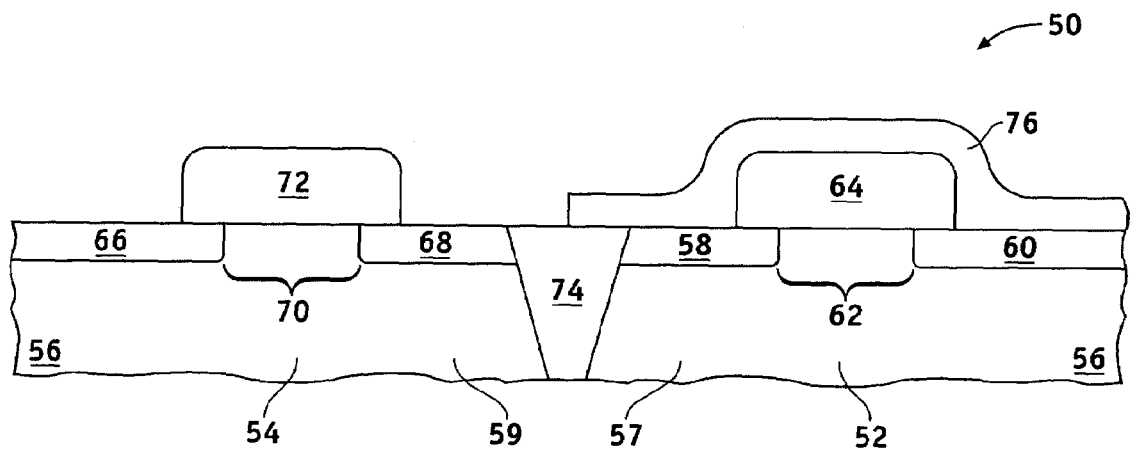
FIG. 2 is a cross-sectional view of an exemplary embodiment of the present invention.

Referring to FIG. 2, a portion of a cell 50 of an SRAM device in accordance with an exemplary embodiment of the present invention is illustrated. The portion of the cell comprises a PFET 52, such as pull-up PFET 16 or 18 of FIG. 1, formed in an N-type region 57 of substrate 56, and an NFET 54, such as pull-down NFET 12 or 14 of FIG. 1, formed in a P-type region 59 of substrate 56. PFET 52 and NFET 54 are fabricated in and on a substrate 56, such as a silicon substrate or any other suitable substrate known in the semiconductor industry. PFET 52 comprises a source region 60, a drain region 58, and a channel region 62 above which overlies a gate region 64. Similarly, NFET 54 comprises a source region 66, a drain region 68, and a channel region 70 above which overlies a gate region 72. PFET 52 and NFET 54 are electrically coupled, as illustrated by the electrical coupling of PFET 16 and NFET 12, or PFET 18 and NFET 14 of FIG. 1, but are physically isolated by a shallow trench isolation 74.

Cell 50 further comprises a tensile-stressed strain film 76 that is formed on the gate region 64 and at least a portion of the source region 58 and drain region 60 of PFET 52. Tensile-stressed strain film 76 may comprise any material that, when deposited on the gate region 64 and at least a portion of the source region 58 and the drain region 60 of PFET 52, applies a uniaxial tensile strain on the channel region 62 of PFET 52. Examples of material suitable for forming tensile-stressed strain film 76 include, but are not limited to, silicon oxide ($SiO_X$, where 0<X), silicon nitride (SiN), silicon oxynitride ($SiO_XN_Y$, where 0<X and 0<Y), and combinations thereof. The tensile-stressed strain film 76 has a thickness that is sufficient to apply a uniaxial tensile stress on channel region 62 but is not so thick that substrate 56 is overstrained and, hence, defected. In one exemplary embodiment of the invention, tensile-stressed strain film 76 has a thickness in the range of about one-third to about one-half of the thickness of gate region 64. In a preferred embodiment of the invention, tensile-stressed strain film 76 has a thickness in the range of about 40 nanometers to about 250 nanometers. In a more preferred embodiment of the invention, tensile-stressed strain film 76 has a thickness in the range of about 80 nanometers to about 110 nanometers.

Tensile-stressed strain film 76 degrades the electrical strength of PFET 52 by decreasing the mobility of carriers through the channel region 62. This degradation of PFET 52 can be used to reduce the size of cell 50, as is described presently.

Figure 3:
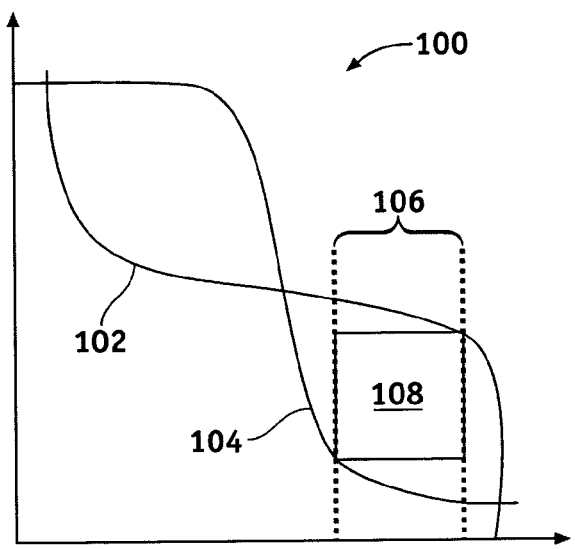
FIG. 3 is a butterfly curve for determining the static noise margin of the cell of FIG. 1.

Static noise margin (SNM) is a principle factor in defining the operational stability of a memory cell, such as cell 50 of FIG. 2. SNM of a cell is measured by obtaining a "butterfly" curve 100 of the cell, as illustrated in FIG. 3. Referring to FIGS. 1 and 3, the butterfly curve is obtained by asserting the voltage on node 24 while plotting the voltage level on the complementary node 26 to obtain a curve 102. A complementary curve 104, gathered by asserting the voltage on node 26 while plotting the voltage level on node 24, is mirrored and reflected on the same graph to obtain the butterfly curve 100. During each voltage sweep, the voltage of the word line 28 and bit lines 30 and 32 are held at Vdd to simulate an actual operating condition of the cell. SNM is defined as the length 106 of a side (in mV) of the largest square 108 that can be drawn inside of both lobes of the butterfly curve.

Typically, SNM is maximized to ensure cell stability in a memory cache. SNM may be increased by increasing the ratio of the strength (that is, the onset current that passes from the drain region to the source region when a transistor is turned ON) of the pull-up PFET 16 or 18 to the strength of the respective pull-down NFET 12 or 14 of the inverter comprising pull-up PFET 16 or 18. The strength, or onset current, of a transistor is directly proportional to the ratio of the width of the transistor to the length of the transistor. Accordingly, the ratio of the strength of the transistors is a function of the ratio of the sizes (width/length) of the transistors.

Transistor ratios (and sizes) of a cell typically are optimized to produce a robust SNM. As transistor properties change, as in the case of using tensile-strained stress films, the ratios also change, thereby requiring a re-calculating of the transistor sizes to retain the initial, optimized transistor ratios. Because the strength of PFETs are weakened with the use of a tensile-stressed strain film, to retain the same transistor ratios and, hence, SNM properties, the strength of the pull-down NFETs must be weakened. One way to weaken the strength of an NFET is to decrease its size (width/length). Accordingly, by using a tensile-stressed strain film overlying the pull-up PFET 16, 18, the size of the corresponding NFET 12, 14 may be decreased, thus decreasing the overall size of the cell 50 while maintaining a stable memory cell with a desired SNM. In addition, by optimizing the SNM transistor ratio while decreasing the size of the cell, the operating voltage of the cell can be decreased. In another exemplary embodiment of the present invention, the size of the PFET 16, 18 may be decreased or minimized and a tensile-stressed strain film may be disposed overlying the PFET. In this regard, the strength of the NFET may be correspondingly weakened by reducing the NFET size even further to retain the same device ratios and SNM properties.

Accordingly, a method for scaling the size of a cell of an SRAM device may begin by electing or assigning a value to a desired ratio of the strength of a pull-up PFET of the cell to a strength of a pull-down NFET that forms an inverter with the PFET according to the equation:

$$Ratio_1 = Strength_1 \text{ of pull-up PFET}/Strength_1 \text{ of pull-down NFET}.$$

Typically, the dimensions of the pull-up PFET initially are minimized pursuant to a set of design rules that will be used to design the cell, although the PFET may be designed with any desired initial dimensions. The strength of the PFET when a tensile-strained stress film is deposited on the PFET (i.e., $Strength_2$) then is determined, such as through experimentation. Next, a second strength of the NFET that would give a ratio, $Ratio_2$, with $Strength_2$ of the PFET that is approximately equal to $Ratio_1$ is calculated according to the equation:

$$Ratio_1 = Ratio_2 = Strength_2 \text{ of pull-up PFET}/Strength_2 \text{ of pull-down NFET, or } Strength_2 \text{ of pull-down NFET} = Strength_2 \text{ of pull-up PFET}/Ratio_1.$$

Having calculated the second strength of the pull-down NFET, which is less than $Strength_1$ of the pull-down NFET, new, reduced dimensions of the NFET can be calculated, as the strength of the pull-down NFET is directly proportional to the ratio of its width to its length.

Figure 4:
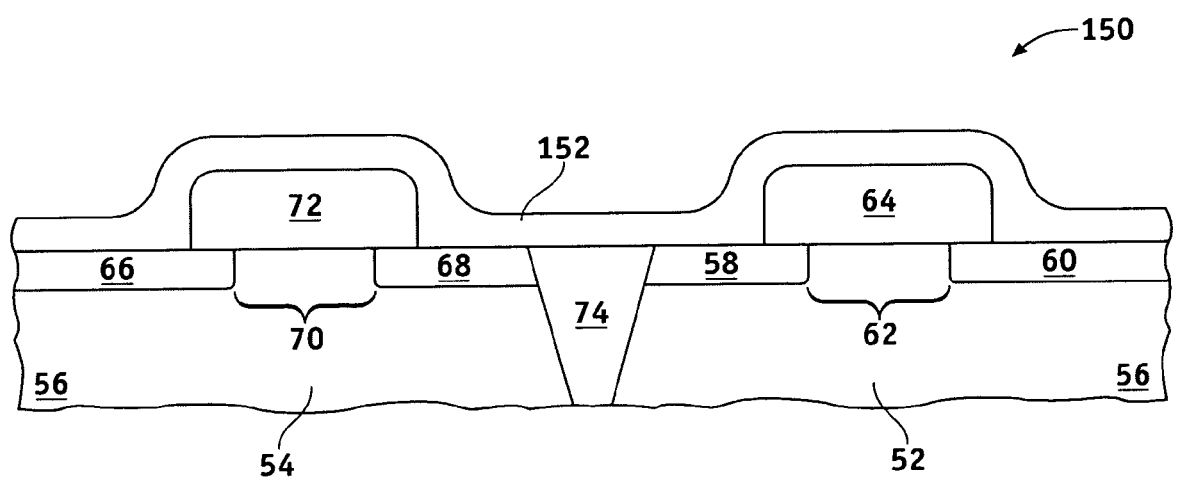
FIG. 4 is a cross-sectional view of another exemplary embodiment of the present invention.

Referring to FIG. 4, in accordance with another exemplary embodiment of the present invention, a portion of a cell 150 of an SRAM device comprises a PFET 52, such as PFET 52 of FIG. 2, and an NFET 54, such as NFET 54 of FIG. 2. Cell 150 further comprises a tensile-strained stress film 152 overlying the gate regions and at least a portion of the source regions and drain regions of both PFET 52 and NFET 54. Tensile-strained stress film 152 may be formed of any of the materials and have any thickness described above for tensile-strained stress film 76 of FIG. 2. As described above, the tensile-strained stress film 152 of the present invention degrades the electrical strength of PFET 52 by decreasing the mobility of carriers through the channel region 62. In contrast, tensile-strained stress film 152 enhances the electrical strength of NFET 54 by increasing the mobility of carriers through the channel region 70. Thus, to retain a pre-determined transistor ratio, presumably optimized to produce a robust SNM, the strength of the NFET 54 must be weakened to compensate for the degradation of strength of PFET 52 and to compensate for the increase in strength of NFET 54. Accordingly, the size of NFET 54 may be suitably decreased, which in turn decreases the overall size of cell 150 and, hence, the resulting memory array.

Figure 5:
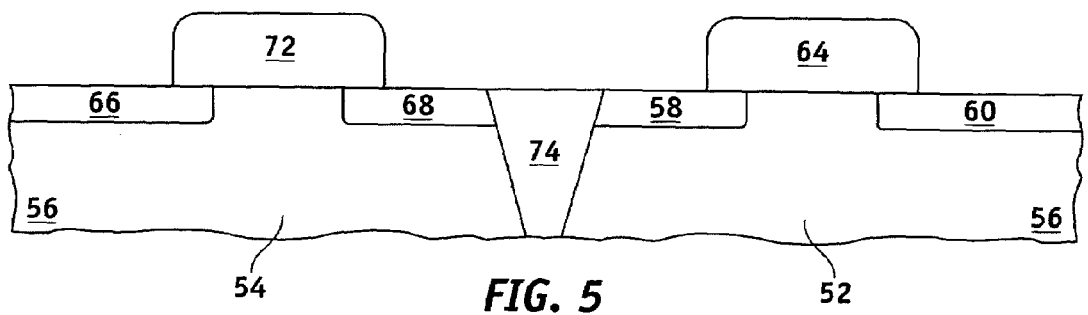
FIGS. 5–7 illustrate a process for fabricating cell structure in accordance with an exemplary embodiment of the present invention.
Figure 6:
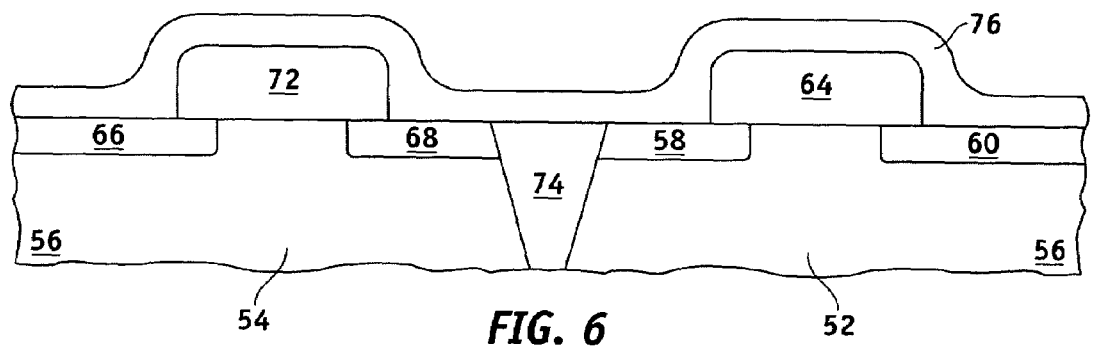
Figure 7:
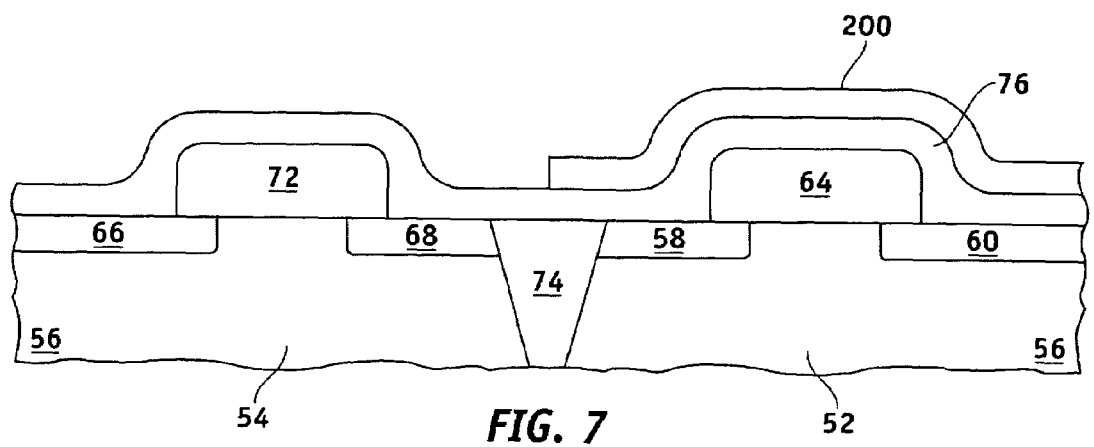

FIGS. 5–7 illustrate an exemplary embodiment of a process for fabricating a cell of an SRAM, such as cell 50 of FIG. 2 or cell 150 of FIG. 4. Referring to FIG. 5, the process comprises fabricating an NFET, such NFET 54 of FIG. 2, in and on a substrate, such as the P-type portion 59 of substrate 56. NFET 54 includes an N-type source region 66, an N-type drain region 68, and a gate region 72. Any suitable, conventional method for fabricating the NFET may be utilized. Before, during, or after fabrication of the NFET, a PFET, such as PFET 52, is formed in and on the N-type portion 57 of the substrate to form an inverter with the NFET. PFET 52 includes a P-type drain region 58, a P-type source region 60 and a gate region 64. Any suitable, conventional method for fabricating the PFET may be utilized. For example, the process may be employed as part of a CMOS integrated circuit fabrication process flow in which both the NFET and PFET are formed in and on a silicon wafer. The NFET 54 and the PFET 52 are both fabricated such that, upon fabrication of the PFET and the NFET, the PFET and the NFET may be electrically coupled and are physically isolated.

Next, referring to FIG. 6, a tensile-stressed strain film, such as tensile-stressed strain film 76 of FIG. 2, may be deposited overlying gate regions and at least portions of source regions and drain regions of PFET 52 and NFET 54. As described above, tensile stress in the channel region of the PFET results in a decrease of carrier mobility through the channel of the PFET, thereby degrading the PFET performance. In contrast, tensile stress in the channel region of the NFET results in an increase of carrier mobility through the channel of the NFET. The tensile-stressed strain film 76 may be deposited using any suitable method known in the semiconductor industry, such as, for example physical vapor deposition (PVD), chemical vapor deposition (CVD), atomic layer deposition (ALD), and the like. In an exemplary embodiment of the invention, tensile-stressed strain film 76 is a silicon nitride layer that may be deposited using a PECVD deposition process with a high frequency RF plasma excitation power of about 400 W or less at a frequency of about 13.56 MHz, such as about 300–400 W at a pressure of about 1 to about 10 Torr, preferably 1.7–2.1 Torr, using $NH_3$, $SiH_4$, and $N_2$ gases. In addition, low frequency RF heater power may be provided, for example, at about 400–500 W. In one embodiment of the invention, the PECVD process comprises providing $NH_3$ gas at about 2–4 slm, $SiH_4$ gas at about 300–400 sccm, and $N_2$ gas at about 2–4 slm while depositing the silicon nitride layer at a temperature of about 300 to about 500° C. The low level of plasma excitation voltage in combination with the use of low frequency RF heater power has been found to impart tensile strain on the channel of the PFET and on the channel of the NFET, although other process parameters and techniques may be employed for forming the tensile-stressed strain film. After deposition of the tensile-stressed strain film, if a cell structure such as cell 150 of FIG. 4 is desired, further back-end processes as are known then may be carried out, such as the fabrication of one or more interconnect structures for subsequent interconnection of the transistor gate and source/drain regions to other electrical components.

In an alternative embodiment of the invention, if a cell structure such as cell structure 50 of FIG. 2 is desired, the process may continue with the formation of a patterned resist mask 200 on the tensile-stressed strain film 76 over PFET 52 and exposing the portion of tensile-stressed strain film 76 over the NFET 54, as illustrated in FIG. 7. Any suitable photolithographic or other patterning techniques may be employed in forming the resist mask 200, as are known in the art. A patterned etch process is performed to remove the exposed portion of the tensile-stressed film 76 over the NFET 54, while leaving the tensile-stressed strain film 76 over the PFET transistor 52, resulting in the cell structure 50 of FIG. 2. Any appropriate wet or dry etch process may be used to remove the exposed tensile-stressed strain film 76 in accordance with the invention. After removal of the tensile-stress strain film from NFET 54, further back-end processes as are known then may be carried out.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for fabricating a cell of an SRAM device, the method comprising the steps of:
   fabricating an NFET in and on a substrate, wherein the NFET has a gate region, a source region, a drain region, and a channel region disposed within said substrate below said gate region and between said source and drain regions;
   fabricating a PFET in and on said substrate, wherein said PFET has a gate region, a source region, a drain region, and a channel region disposed within said substrate below said gate region and between said source and drain regions, and wherein, upon fabrication of said PFET and said NFET, said PFET and said NFET are electrically coupled and are physically isolated;
   depositing a tensile-strained stress film on said gate region and at least a portion of said source region and said drain region of said PFET to decrease the mobility of carriers through the channel region of said PFET; and completing fabrication of the cell such that, during operation of the cell, the mobility of carriers through said channel region of said PFET is decreased.

2. The method of claim 1, wherein the step of depositing a tensile-strained stress film comprises depositing a material selected from the group consisting of silicon oxide ($SiO_X$, where $0<X$), silicon nitride (SiN), silicon oxynitride ($SiO_XN_Y$, where $0<X$ and $0<Y$).

3. The method of claim 1, wherein the step of depositing a tensile-strained stress film comprises depositing said tensile-strained stress film to a thickness in the range of about one-third to about one-half of a thickness of said gate region of said PFET.

4. The method of claim 1, wherein the step of depositing a tensile-strained stress film comprises depositing said tensile-strained stress film to a thickness in the range of about 40 nanometers to about 250 nanometers.

5. The method of claim 1, wherein the step of depositing a tensile-strained stress film comprises depositing said tensile-stained stress film utilizing physical vapor deposition, chemical vapor deposition, atomic layer deposition, or a combination thereof.

6. The method of claim 1, wherein the step of depositing a tensile-strained stress film on said gate region and at least a portion of said source region and said drain region of said PFET comprises depositing a silicon nitride layer using a PECVD deposition process with a high frequency RF plasma excitation power of about 400 W or less.

7. The method of claim 6, wherein the step of depositing a silicon nitride layer using a PECVD deposition process comprises providing high frequency RF plasma excitation power in the range of from about 300 W to about 400 W and providing low frequency RF heater power in the range of from about 400 W to about 500 W at a pressure in the range of from about 1 Torr to about 10 Torr using gases.

8. The method of claim 7, wherein the step of depositing a silicon nitride layer using a PECVD deposition process comprises providing $NH_3$ gas at a flow rate in the range of from about 2 to about 4 slm, providing $SiH_4$ gas at a flow rate in the range of from about 300 sccm to about 400 sccm, and providing $N_2$ gas at a flow rate in the range of from about 2 slm to about 4 slm.

9. The method of claim 1 wherein the step of depositing a tensile-strained stress film on said gate region and at least a portion of said source region and said drain region of said PFET further comprises the step of depositing said tensile-stained stress film on said gate region and at least a portion of said source region and said drain region of said NFET.

10. A method for fabricating a CMOS device, the method comprising the steps of:

selecting a value for a ratio of a first strength of a PFET to be fabricated as a portion of the CMOS device and a first strength of an NFET to be fabricated as a portion of the CMOS device, wherein said PFET is to have predetermined dimensions that correspond to said first strength of said PFET;

determining a second strength of said PFET when a tensile-strained stress film is deposited on said PFET;

calculating a second strength of said NFET using said second strength of said PFET and said ratio;

determining dimensions of said NFET corresponding to said second strength of said PFET;

fabricating said NFET in and on a substrate, wherein said NFET has said determined dimensions;

forming said PFET having a channel region, a gate region, a source region, and a drain region in and on said substrate such that, upon fabrication of said PFET and said NFET, said PFET and said NFET are electrically coupled and are physically isolated; and depositing said tensile-strained stress film on said gate region and at least a portion of said source region and said drain region of said PFET such that a uniaxial tensile strain is applied to said channel region of said PFET.

11. The method of claim 10, wherein the step of depositing said tensile-strained stress film on said gate region and at least a portion of said source region and said drain region of said PFET comprises depositing a silicon nitride layer using a PECVD deposition process with a high frequency RF plasma excitation power of about 400 W or less.

12. The method of claim 11, wherein the step of depositing a silicon nitride layer using a PECVD deposition process comprises providing high frequency RF plasma excitation power in the range of from about 300 W to about 400 W and providing low frequency RF heater power in the range of from about 400 W to about 500 W at a pressure in the range of from about 1 Torr to about 10 Torr using $NH_3$, $SiH_4$ and $N_2$ gases.

13. The method of claim 12, wherein the step of depositing a silicon nitride layer using a PECVD deposition process comprises providing $NH_3$ gas at a flow rate in the range of from about 2 to about 4 slm providing $SiH_4$ gas at a flow rate in the range of from about 300 sccm to about 400 sccm, and providing $N_2$ gas at a flow rate in the range of from about 2 slm to about 4 slm.

14. The method of claim 10, wherein the step of depositing a said tensile-strained stress film comprises depositing said tensile-strained stress film utilizing physical vapor deposition, chemical vapor deposition, atomic layer deposition, or a combination thereof.

15. The method of claim 10, wherein the method further comprises enhancing a carrier mobility of said NFET by depositing said tensile-strained stress film on a gate region and at least a portion of a source region and a drain region of said NFET.

* * * * *